(12) United States Patent
Iyengar et al.

(10) Patent No.: US 11,895,807 B2
(45) Date of Patent: Feb. 6, 2024

(54) THERMAL MANAGEMENT OF BATTERY UNITS ON DATA CENTER RACKS

(71) Applicant: Google LLC, Mountain View, CA (US)

(72) Inventors: Madhusudan K. Iyengar, Foster City, CA (US); Melanie Beauchemin, Mountain View, CA (US); Christopher Malone, Mountain View, CA (US)

(73) Assignee: Google LLC, Mountain View, CA (US)

( * ) Notice: Subject to any disclaimer, the term of this patent is extended or adjusted under 35 U.S.C. 154(b) by 521 days.

(21) Appl. No.: 16/885,500

(22) Filed: May 28, 2020

(65) Prior Publication Data

US 2021/0378132 A1   Dec. 2, 2021

(51) Int. Cl.
| | |
|---|---|
| *G06F 1/16* | (2006.01) |
| *H05K 5/00* | (2006.01) |
| *H05K 7/00* | (2006.01) |
| *H05K 7/20* | (2006.01) |
| *H01M 10/613* | (2014.01) |

(52) U.S. Cl.
CPC .......... *H05K 7/208* (2013.01); *H01M 10/613* (2015.04); *H05K 7/20936* (2013.01)

(58) Field of Classification Search
CPC ............... H05K 7/208; H05K 7/20809; H05K 7/20936; H05K 7/2089
See application file for complete search history.

(56) References Cited

U.S. PATENT DOCUMENTS

| | | | | |
|---|---|---|---|---|
| 7,128,219 B2 * | 10/2006 | Marraffa | ............. | H01M 50/262 |
| | | | | 211/49.1 |
| 7,489,509 B2 * | 2/2009 | Keenan | ............. | H05K 7/20572 |
| | | | | 361/708 |
| 9,025,330 B2 | 5/2015 | Hodes et al. | | |
| 9,401,500 B2 * | 7/2016 | Kwak | ............... | H01M 10/6551 |
| 9,681,589 B1 * | 6/2017 | Ross | .................... | H05K 7/2029 |
| 9,861,015 B2 | 1/2018 | Sagneri et al. | | |
| 10,570,542 B2 | 2/2020 | Catallo | | |

(Continued)

FOREIGN PATENT DOCUMENTS

| | | |
|---|---|---|
| CN | 202196817 U | 4/2012 |
| CN | 205723865 U | 11/2016 |

(Continued)

OTHER PUBLICATIONS

Battery Cabinets. Phase Change Products Pty Ltd (PCP), PCP Australia, 2020. Last accessed on Mar. 11, 2020. 2 pages. Retrieved from the Internet: <https://pcpaustralia.com.au/pcm-applications/battery-cabinets/>.

(Continued)

*Primary Examiner* — Anthony M Haughton
(74) *Attorney, Agent, or Firm* — Lerner David LLP (57) ABSTRACT

A data rack system includes a data center rack frame, a shelf positioned within the data center rack frame; and a modular battery unit disposed on the shelf. The modular battery unit further includes a housing having an outer surface, a plurality of strips of phase change material ("PCM") attached to the outer surface and spaced apart from one another; and air flow channels. The air flow channels are formed in spaces between two adjacent strips of the plurality of strips and defined by a shape and size of the spaces between the two adjacent strips.

20 Claims, 11 Drawing Sheets

(56) References Cited

U.S. PATENT DOCUMENTS

2015/0037649 A1  2/2015  Wyatt et al.
2017/0038802 A1  2/2017  Kwon et al.

FOREIGN PATENT DOCUMENTS

EP       3145708 A1    3/2017
KR       100896769 B1  5/2009

OTHER PUBLICATIONS

Marongiu. Thermal Management of Electronic Equipment using Phase Change Materials (PCMs). Electronics Cooling. Mar. 6, 2019. Last accessed on Mar. 11, 2020. 13 pages. Retrieved from the Internet: <https://www.electronics-cooling.com/2019/03/thermal-management-of-electronic-equipment-using-phase-change-materials-pcms/>.
Extended European Search Report for European Patent Application No. 20211034.2 dated May 11, 2021. 7 pages.

* cited by examiner

THERMAL MANAGEMENT OF BATTERY UNITS ON DATA CENTER RACKS

BACKGROUND

This application relates to the field of electronics, and particularly the thermal management and cooling of modular battery units on a data center rack of a server system. As modular battery units and other equipment on the rack operate, these components generate heat. This heat can lead to reduced life and damage to the components. Because of the close configuration of the components in the rack, sufficient cooling of the components can be difficult.

Corporations operating large-scale computing systems invest significant amounts of capital to establish and maintain the equipment comprising the computing systems. These computing systems are typically stored in data centers, which require expensive hardware and equipment, as well as real estate and personnel to maintain the equipment stored in the data centers. To minimize costs, data center racks and the equipment thereon are designed to be compact and capable of functioning over extended periods of time, as well as modular to accommodate changing architecture and configuration of components within the computing system.

Battery backup power is critical to maintaining data integrity. Voluminous amounts of data that reside in electronic storage require backup power to prevent loss if primary alternating current (AC) power sources fail. A "hard" shutdown due to power loss can cause data corruption and the inability to restart a server or appliance. Similarly, hard drives in the system can be irreparably damaged by a sudden power loss.

Battery backup power can be utilized to provide the power needed to sustain system operation during AC power failure. When a power failure occurs, the computing system is configured to automatically switch to battery backup power to power the system. Backup battery units are intended to keep servers running at full power on the order of seconds to minutes before backup generators take over. The battery backup units will continue to run and power the system until utility power returns to safe levels or the batteries are fully discharged.

Once utility power has been restored, the battery back up power can automatically recharge to prepare for the next power outage, a process known as the discharge cycle. However, a battery can only undergo so many discharge/recharge cycles before it reaches the end of its usable life, and must be replaced.

Batteries have rated capacities dependent on specified conditions. Typical backup batteries, such as a lithium ion battery, are uninterruptable power sources ("UPS") and have a rated capacity based on an ambient temperature of 25° C. (77° F.). Maintaining operation of the UPS battery under these conditions can maximize the life of the battery and achieve optimal performance. During operation of the battery during power failure, significant amounts of heat are generated, causing a significant rise in ambient temperature. Additionally, ambient heat from surrounding equipment can cause an increase in ambient temperature. While the UPS battery can continue to operate at increased or reduced temperatures, doing so diminishes both the performance and life of the battery. Therefore, maintaining the UPS battery at a constant and desired ambient temperature is critical to extending the life of the UPS battery and optimal performance. Moreover, due to the intermittent use of backup battery units, such battery units must be maintained in a state that allows the battery units to operate at peak performance at all times.

Modular battery backup units can be distributed among server racks in the data center. These modular battery units present one example of UPS battery backup power, and represent critical and essential electronic equipment housed on a data rack that requires upkeep and maintenance. In one example, modular battery units include a housing, and both a battery and a cooling fan or other internal cooling system may be provided within the housing.

As noted above, heat reduces the life span of a battery making cooling of the battery paramount. Given the high power outputs of each individual and modular battery unit, as well as the other equipment in the data rack and in the data center, high levels of heat are generated. While the modular battery units each individually contain internal cooling systems, such as fans, to distribute and expel heat from the battery unit, significant amounts of heat within and around the battery housing remain and threaten the lifespan and operation of the UPS battery.

BRIEF SUMMARY

Aspects of the present disclosure are advantageous for distributing heat generated during discharge of backup battery units stored on data racks According to an aspect of the disclosure, a data rack system includes a data center rack frame; a shelf positioned within the data center rack frame; and a modular battery unit disposed on the shelf. The modular battery unit further includes a housing having an outer surface; a plurality of strips of phase change material ("PCM") and air flow channels. The plurality of strips are attached to the outer surface and spaced apart from one another. The air flow channels are formed in spaces between two adjacent strips of the plurality of strips. The air flow channels may be defined by a shape and size of the spaces between the two adjacent strips.

In one example of this aspect, the housing of the modular battery unit includes opposed top and bottom outer surfaces, and opposed side surfaces extending between the top and bottom surfaces. At least one strip of the plurality of strips is positioned on a top surface of the modular battery unit. At least one of the plurality of strips can further include a width that changes between a first end of the at least one strip to an opposed second end of the at least one strip. Alternatively, the plurality of strips may be a first plurality of strips, and the system may further include a second plurality of strips of phase change material that are disposed on at least one surface of the shelf. The at least one surface of the shelf may be an interior surface facing toward a bottom surface of the modular battery unit.

In another example of this aspect, air flow channels direct air in one direction. The air flow channels can further direct air in two directions.

In another example of this aspect, each of the plurality of strips has an outer edge, and a shape of the air flow channels is further defined by a contour of the outer edge. The contour can include a straight line, and in one example, at least at least two of the plurality of strips are elongated strips having a rectangular shape. The contour can instead be a curved line, and in one example, at least two of the plurality of strips have a parabolic shape.

In another example, the plurality of strips are flexible strips. Alternatively, the plurality of strips are rigid.

In another example, the PCM includes a bio based paraffin.

According to another aspect of the disclosure, a modular battery unit for use in a data center rack, includes a housing, a battery disposed within the housing, a plurality of strips of phase change material ("PCM") and air flow channels. The housing my include a top surface and an opposed bottom surface. The plurality of strips may be attached to at least the top Surface and spaced apart from one another. The air flow channels may be provided in spaces between two adjacent strips of the plurality of strips, the air flow channels defined by a shape and size of the spaces between the two adjacent strips.

In another example of this aspect, the air flow channels direct air in one direction.

In another example of this aspect, each of the plurality of strips has an outer edge, and the shape of the air flow channels is further defined by a contour of the outer edge. At least two of the plurality of strips may be elongated strips having a rectangular shape. Additionally or alternatively, at least two of the plurality of strips have a parabolic shape.

DETAILED DESCRIPTION

Overview

According to aspects of the disclosure, improved devices and methods for thermal management of battery units include implementing phase change material directly to each of the modular units, as well as creating air flow channels on the surface of the battery unit. In one example, strips of phase change material can be directly applied to the battery unit housing to reduce heat in the battery unit and create air flow channels between adjacent strips to further the cooling process. Phase change material ("PCM") is configured to alternate between a solid and liquid state during thermal cycling process. The PCM absorbs and releases large amounts of thermal energy (latent heat) when it transitions from solid to liquid and vice versa. When a PCM reaches its phase change temperature (melting point), the PCM absorbs high levels of heat at an almost constant temperature until all the PCM is melted. When freezing, a PCM releases energy as latent heat at a relatively constant temperature. PCM charges (and gets cooled) when transitioning from the liquid to solid phase after the battery stops discharging and is in the idle state, but discharges (gets heated) when transitioning from the solid to liquid phase when the battery is discharging. By melting and solidifying at the phase change temperature, a PCM is capable of storing and releasing amount of energy. Thus, controlling the melting and resolidification of a PCM allows for use of the PCM for heat storage.

PCM may be directly attached to the housing of individual battery units. In one example, strips of PCM are attached to the housing. The strips can be any shape and size. In one example, the strips may be elongated strips or a series of smaller strips that extend along the length of the housing. The strips may be spaced apart from one another so as to create air flow channels therebetween. The air flow channels allow for airflow between each of the PCM strips, to provide enhanced cooling and distribution of heat from the battery units. The strips can also be manufactured in different shapes and sizes, as well as arranged in specific patterns, to maximize the cooling of the battery unit.

Additionally, or alternatively, cooling of the battery unit can be accomplished by providing PCM at the lower surface of the shelf of the server rack. PCM strips and air flow channels can be provided on the shelf to further control the temperature of the battery unit.

The strips of PCM can be compact and allow a technician to easily withdraw individual battery units from the rack for maintenance without the PCM shearing or being inadvertently removed from the battery unit housing. Due to the size, the strips do not impede movement of the shelf into and out of the rack. Further, by providing the strips directly on individual battery units and creating flow channels, enhanced cooling can occur.

Example Server Rack

Figure 1:
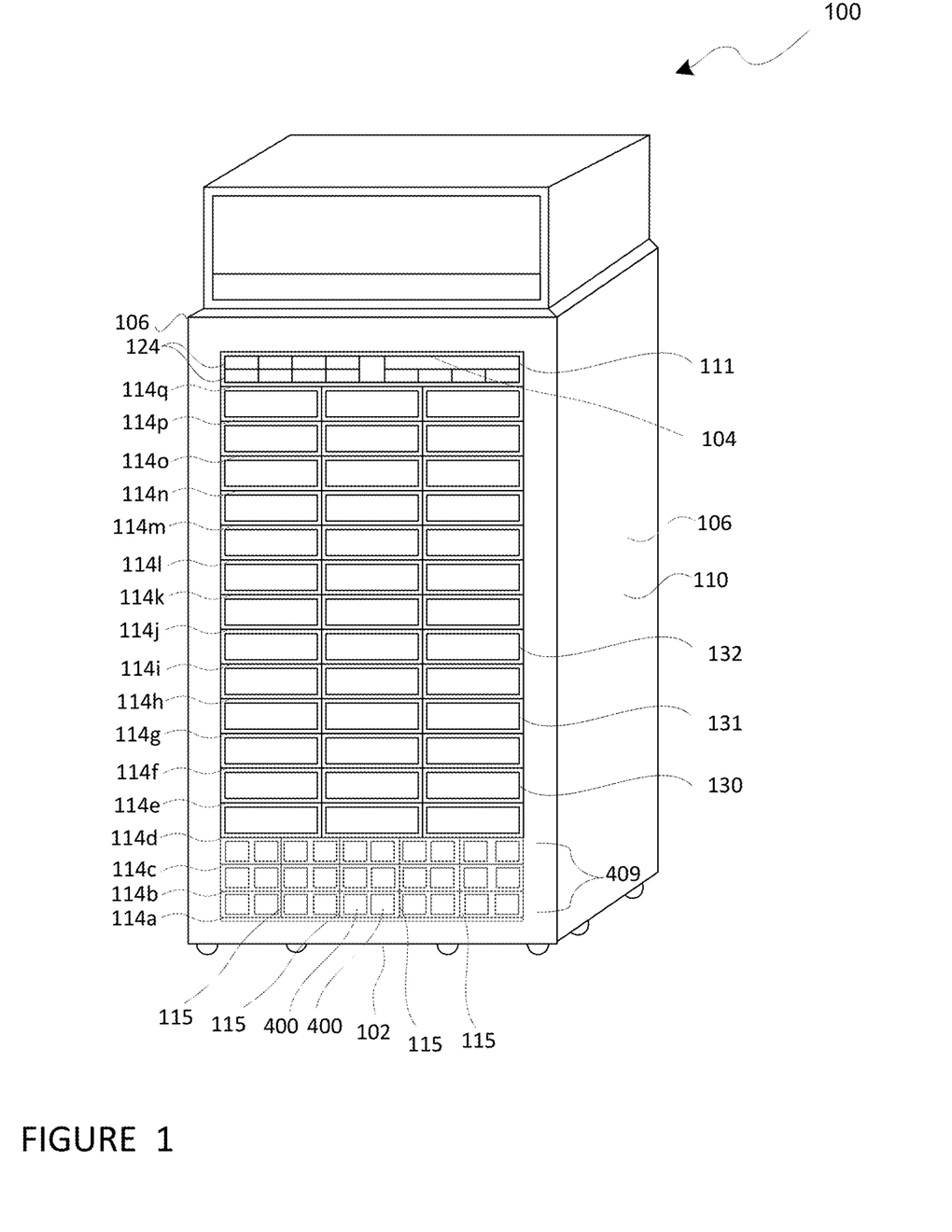
FIGS. 1-2 are example schematic diagrams of rack architectures in accordance with aspects of the disclosure.
Figure 2:
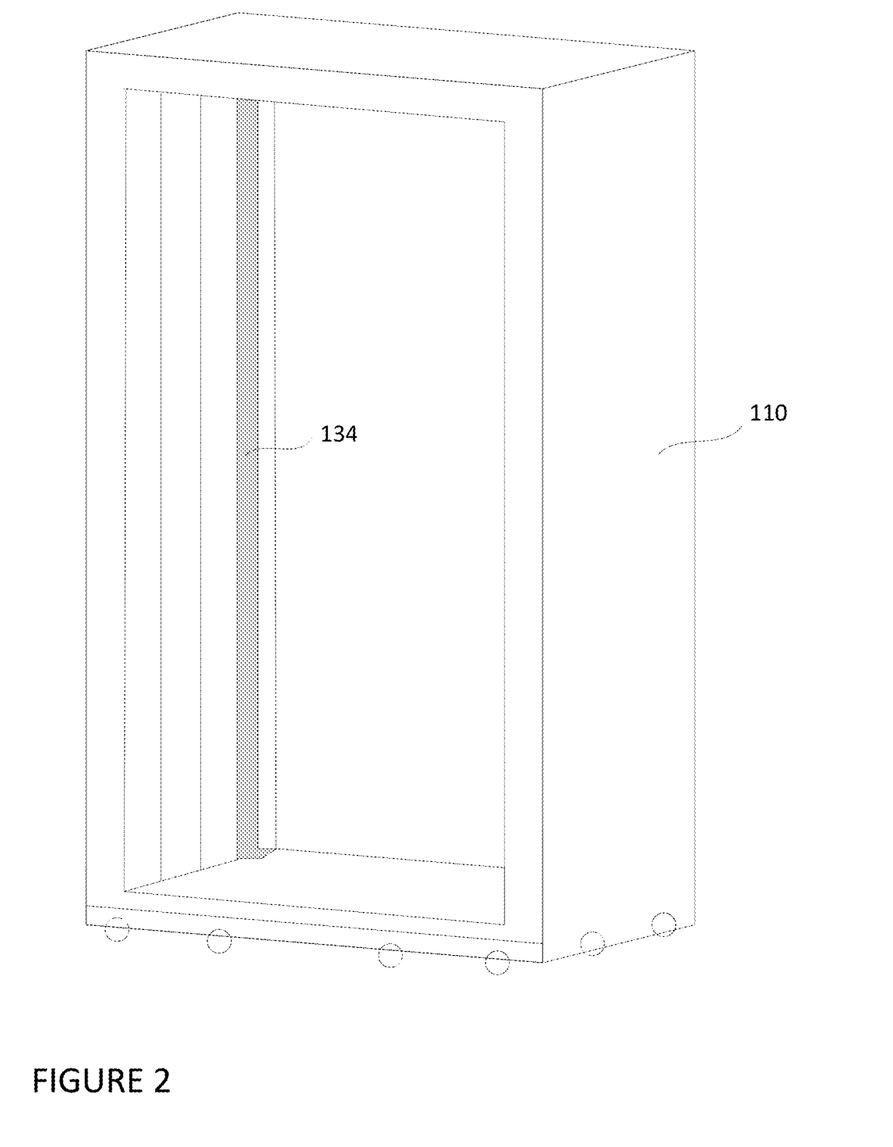

FIGS. 1 and 2 are examples of a mobile rack system. FIG. 1 depicts a server system 100 that may include a mobile data center rack 110 having a floor 102, a ceiling 104, sidewalls 106 extending between the floor 102 and ceiling 104, a plurality of shelves 114*a*-114*q* for holding components, a rack monitoring unit (RMU) 111 for monitoring the status of the features of the rack, a plurality of rectifiers 124, a battery backup 409, including battery units 400, and a plurality of computing components 130-132. FIG. 2 is an example of rack 110 of FIG. 1 without shelves 114*a*-114*q*. In this figure, it can be seen that the rack 110 includes a main bus bar 134.

The server system 100 supplies power from a power source to the computing components. For example, though not shown in the figures, each of the shelves of the rack may be connected to a power supply such, as an AC or DC power source, by way of main bus bar 134. The main bus bar 134 may also be connected to each shelf of the rack in order to provide power and data to the components.

Figure 3:
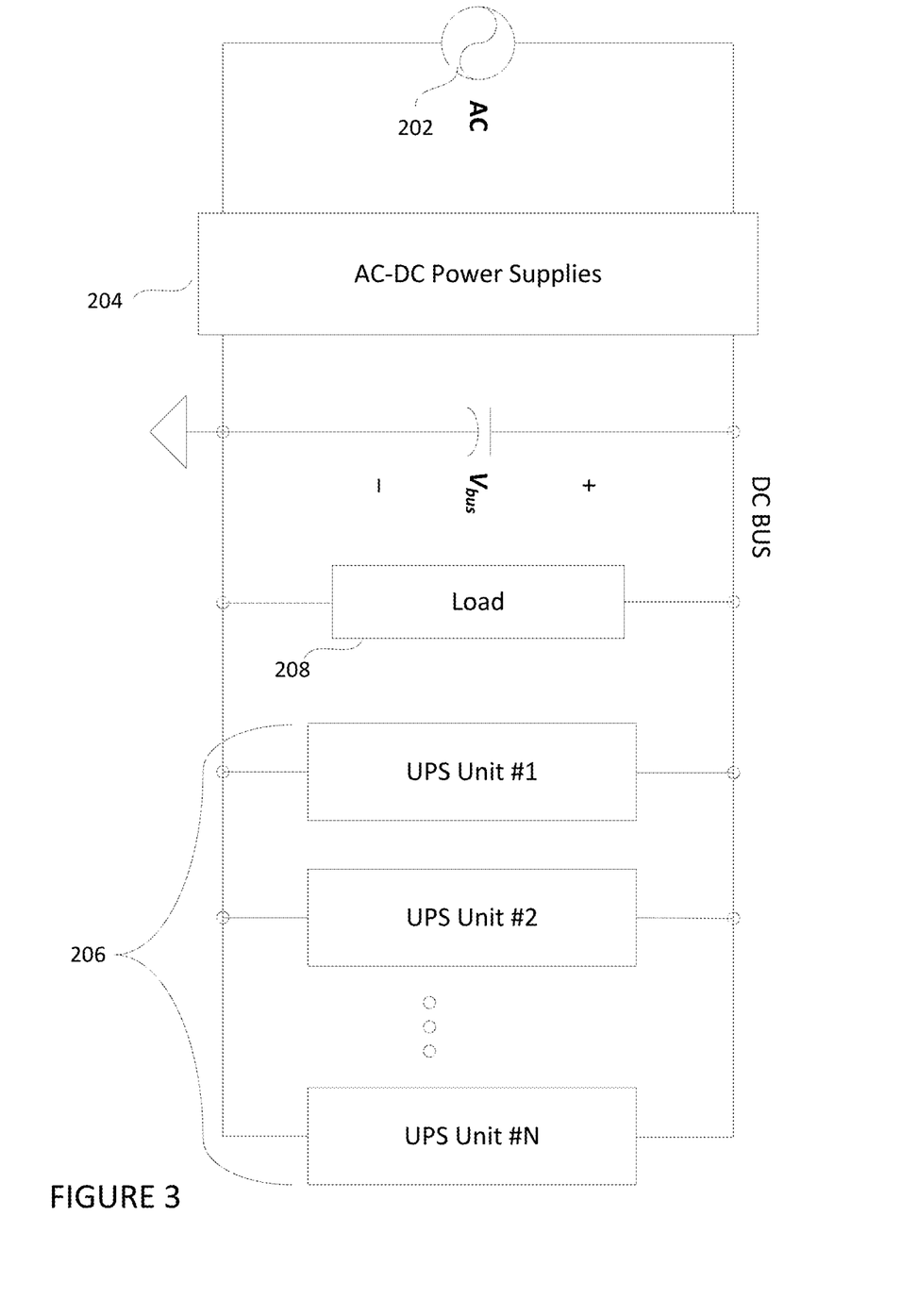
FIG. 3 is a schematic diagram of an example power architecture in accordance with aspects of the disclosure.

FIG. 3 is an example of a power architecture for the server system 100. An AC power source 202 may be connected to the rectifiers 124. In this example, the rectifiers 124 may include 48 volt AC to DC rectifiers 204. The rectifiers are connected to the main bus bar 134 and supply power to a load 208 (including components 130-132 of FIG. 1). The load 208 is connected in parallel to a plurality of uninterruptable power supply units (UPS) 206 (battery units 400 in FIG. 1) which make up the backup battery supply 409. Battery units 400 are disposed on shelves 114a, 114b, and 114c.

As described above, the load 208 may include a plurality of components. Returning to FIG. 1, the shelves 114a-114q of rack 110 may receive and support electronic devices. For example, shelves 114g-114-i may support components 130-132. In one example, component 130 may be a dedicated storage device, for example, including any type of memory capable of storing information accessible by a processor, such as a hard-drive, memory card, ROM, RAM, DVD, CD-ROM, or solid state memory. In another example, component 131 may be a preprogrammed load which draws power from the main bus bar in order to test the operation of the system 100.

Example Battery Unit & Server Shelf

Figure 4:
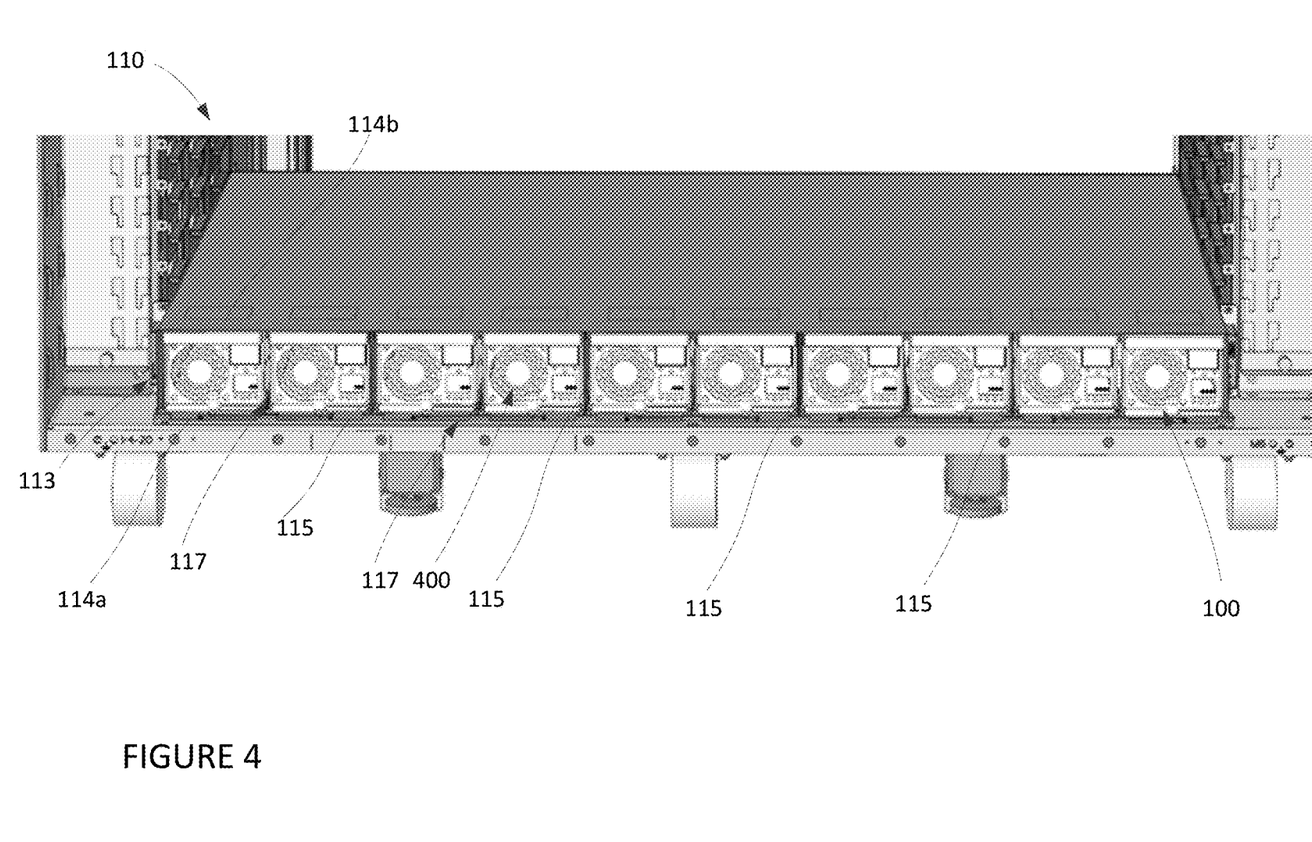
FIG. 4 is an enlarged view of an example of a shelf of a rack architecture shown in FIG. 1.

FIG. 4 provides an enlarged view of the lower portion of rack 110. As discussed above, rack 110 is modular and any number of shelves and components can be provided within rack 110. For ease of discussion and illustration, only a single row 113 of rack 110 is illustrated. The illustrated portion of rack 110 shows bottom shelf 114a, and a plurality of dividers 115. The plurality of dividers 115 create smaller compartments 117 between each of the dividers 115 in row 113. A plurality of battery units 400 are provided along row 113, with two battery units being positioned within each of the compartments 117. In this example, ten battery units 400 are shown, but any number of battery units can be included, including a fewer number of battery units 400, or alternatively additional battery units, which can be made possible if smaller battery units are implemented in the server rack.

Figure 5:
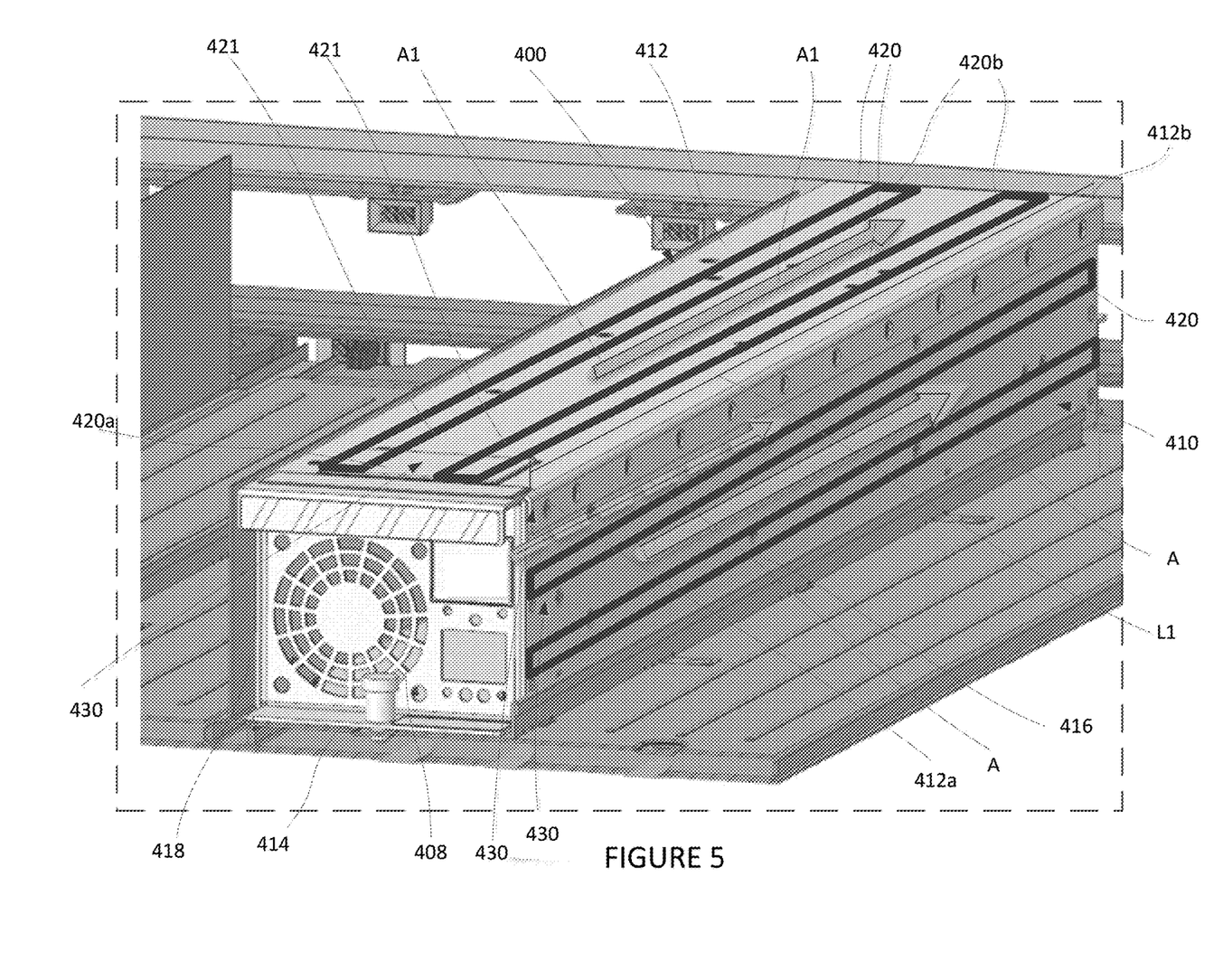
FIG. 5 is an example of a battery unit positioned on the shelf of FIG. 4 according to aspects of the disclosure.

FIG. 5 is an enlarged view showing a single battery unit 400 on shelf 114a. For ease of discussion. Each battery unit 400 is a modular unit and configured to be removably positioned on shelf 114a and within the respective compartments 117. Battery unit 400 may be a conventional uninterruptable power source, as discussed above. Battery unit may house a battery (not shown), such as a lithium battery, as well as an internal cooling unit (not shown) such as a fan to dissipate heat within the battery unit 400 through openings 408 in battery unit 400, in addition to numerous other components that allow for operation of battery unit 400 and that are beyond the scope of the present disclosure. The battery housing 410 may include a top surface 412 and bottom surface 414, as well as a right edge surface 416 and an opposed left edge surface 418, both of which extend between and join the top and bottom surfaces 412,414.

To distribute heat generated within battery unit 400 during battery discharge, a combination of PCM and air flow channels can be provided on one or more outer surfaces of the housing 410 of battery unit 400. Biobased paraffins are a cost effective PCM that can be utilized to dissipate heat from battery unit 400, due to its large latent heat, low vapor pressure when melted, and good chemical stability over many heating and freezing cycles. Additionally, paraffins are non-corrosive, compatible with most materials, and non-reactive to the majority of materials encapsulating PCM. Biobased paraffins may be used with the battery units, which are typically formed from metal. However, an alternative PCM can be selected, such as natural paraffins, pure fatty acids, salt hydrates and other known phase change materials.

The structural form of the PCM provided on the housing 410 of battery unit 400 can vary. In one example, as shown in FIG. 5, flexible PCM strips 420 may be attached to the housing 410 of battery unit 400. The PCM strips 420 can include PCM configured to provide high latent heat energy storage density for the purpose of thermal management. In the example of PCM bio based paraffins, the PCM strips 420 can have a latent heat capacity ranging from 100-300 J/g and a melting point ranging from 20-60° C. But, in other examples, the latent heat capacity and melting point may be less than or greater than a number in one of the above ranges.

PCM strips 420 may be elongated strips having a rectangular shape. In this example, PCM strips 420 have continuous and linear edges 421. PCM strips 420 are spaced apart from one another across the surface of outer housing 410 and extend parallel to one another. In other examples, and as discussed below, PCM strips 420 may be provided in different configurations and shapes.

Figure 6:
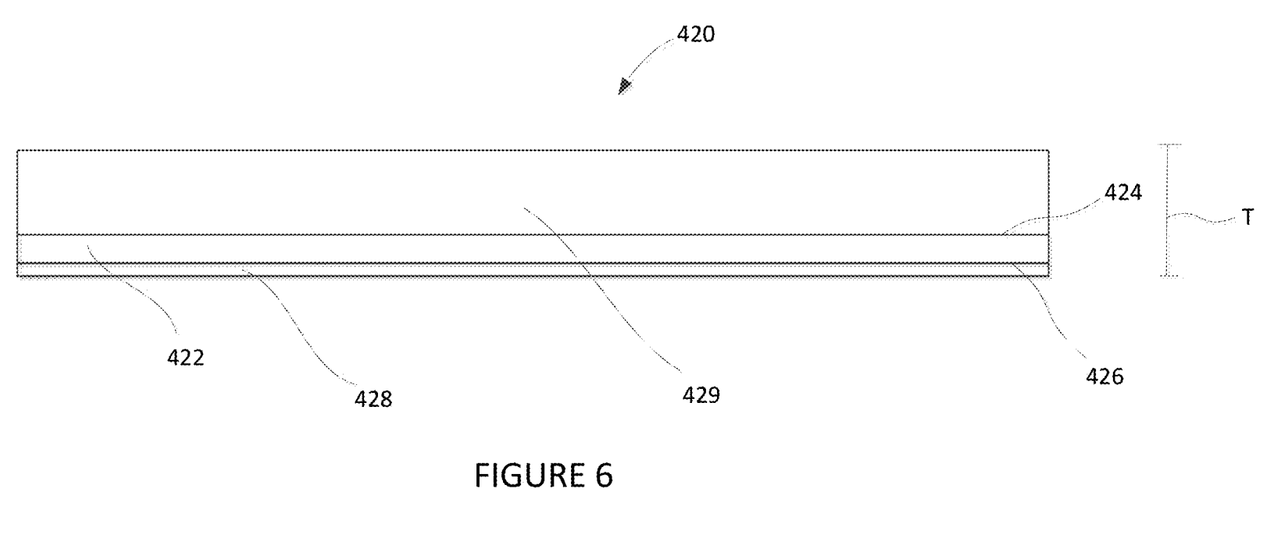
FIG. 6 is a schematic diagram of a side view of a strip of phase change material ("PCM") according to aspects of the disclosure.

FIG. 6 illustrates an example PCM strip. As shown, PCM strip 420 may include a PCM carrier 422 having a top surface 424 and a bottom surface 426. Carrier 422 supports main body 429 and is the structure that can be used to attach the PCM to the outer housing. PCM materials, such as biobased paraffins, may be encapsulated within a base material to form the main body 429. To further enhance thermal conductive properties, the biobased paraffin can be further combined or impregnated with high thermally conductive materials, which can include dispersing highly conductive nanoparticles in the PCM.

An adhesive matrix 428 may be disposed at bottom surface 426 of carrier 422. When activated, adhesive matrix 428 can be used to attach PCM strip 420, and particularly the carrier 422 and main body 429 to the outer surface of the housing of battery unit 400. Alternatively, adhesive matrix 428 may be omitted and a separate adhesive or thermal paste or the like may be applied to bottom surface 426 of strip when PCM strip 420 is being secured to battery housing 410. Still further, carrier 422 may be a material that has "tacky" properties and can be adhered to outer surface of the housing of battery unit 400 without a separate adhesive applied to carrier 422.

Figure 7:
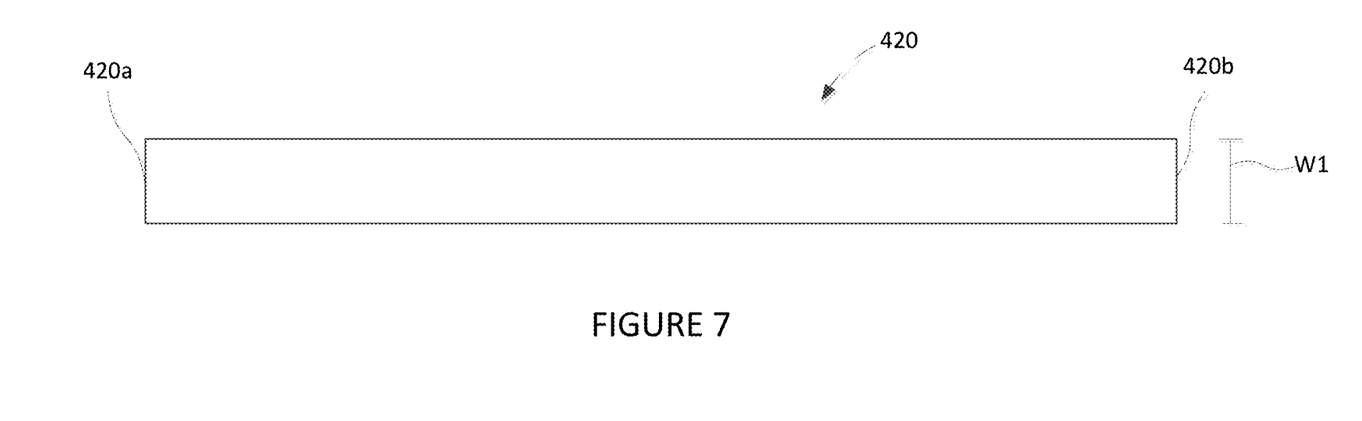
FIG. 7 is a schematic diagram of a top view of a PCM strip according to aspects of the disclosure.

PCM strip 420 can be cut from larger sheets of PCM material or pre-manufactured to meet custom specifications. PCM strips 420 preferably have a thin profile so that they may be utilized on pre-existing battery units and within existing server rack configurations. In one example, the PCM strips have a thickness T of 0.1 inches, a width of 1 inch, and a length of 24 inches. Additionally, as shown in FIG. 7, PCM strips may have a width W1 of 1 inch. In other examples, the length can range anywhere from 2-23 inches; the thickness may range anywhere from 0.01 inches to 3 inches; the width W1 can range anywhere from 0.50 inches to flinches. It is to be appreciated that these ranges can vary widely depending on the mass density of the selected PCM material, as well as the shape, size and number of battery units on a shelf. In this regard, the length L, thickness T, and width W can also be above or below the above identified ranges.

Figure 8:
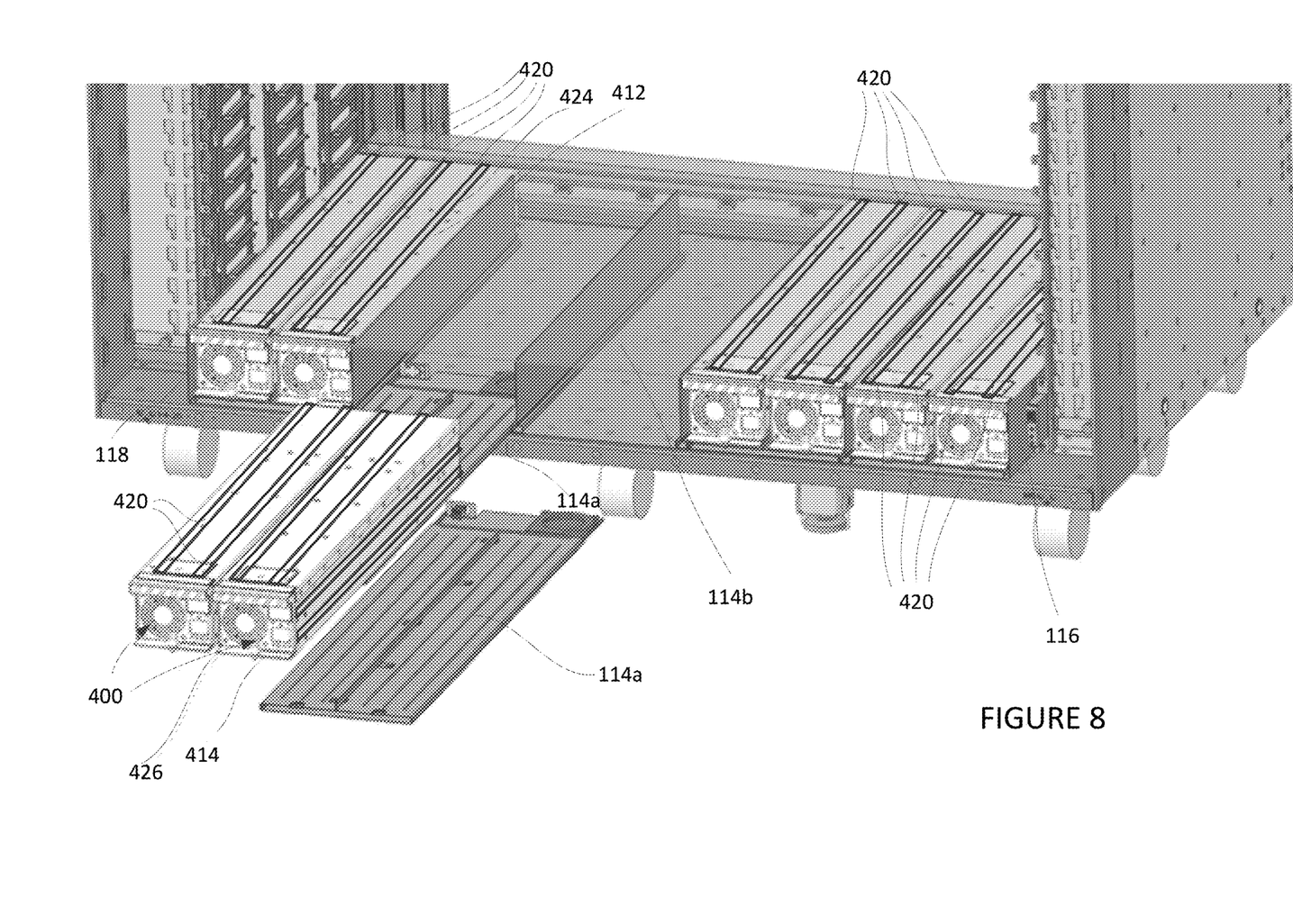
FIG. 8 is an example of multiple battery units on a shelf of a data rack according to aspects of the disclosure.

In this regard, the combined battery unit 400 and PCM strip 420 are capable of fitting within a preexisting clearances between the pre-existing shelf 114a and rack architecture and battery units. For example, as shown in FIG. 8, in which shelf 114b is shown as translucent for purposes of illustration, there is a pre-existing clearance between right and left edge surfaces 116, 118 and an adjacent battery unit 400 or divider 115. Similarly, there is a clearance between interior top surface 114b of shelf 114a and the top surface 424 of PCM strips 420 and top surface of battery units 400. Finally a pre-existing clearance exists to allow for clearance between bottom surface 426 of battery unit 400 and shelf 114a. Battery units 400 with attached PCM strips 420 can fit into the existing architecture and arrangement of rack 110, without requiring a redesign of battery units 400 or server rack architecture 110.

Utilizing PCM strip 420, which in this example has a low profile, does not inhibit movement of battery unit 400 into and out of rack 110. This can provide technicians with the ability to easily conduct routine maintenance and inspections of battery units 400 without having to remove one or more PCM strips 420 or without inadvertently removing one or more PCM strips as the battery unit 400 is pulled out of rack 110.

The size of the strips can be further optimized based on the amount of desired PCM material required to be included in the PCM materials intended to regulate cooling of battery units on a particular shelf. In an example where a paraffin is selected as the PCM material and has a mass density of 900 kg/m2, and a latent heat capacity of 170 J/g is desired, approximately 0.1-0.2 pounds of paraffin are required per battery/shelf tray. In an example where there are 10 battery units per shelf and 3 strips per battery unit, each of the 30 strips can be 24 inches long, 1 inch wide, and 0.1 inches thick. For example, in an arrangement that includes 10 battery units per shelf and there are only 3 strips per batty unit, 30 strips 24 inches long, 1 inch wide and 0.1 inch thick may be utilized. Depending on the desired results, numerous modifications can be made to the size of the strip (e.g., length, width, thickness), as well as the selected PCM material and the amount of material within the PCM strip.

PCM strips 420 may be arranged on any surface of housing 410. With reference back to FIG. 5, in one example, PCM strips 420 are arranged on top surface 412, right edge surface 416, and left edge surface 418 (not shown) of housing 410. PCM strips 420 can also be provided on bottom surface 414 of housing 410 (not shown). PCM strips 420 may be arranged to extend along an entire length L1 of housing 410 of battery unit 400. As shown, PCM strips 420 are disposed on top surface 412 of housing 410. In this example, first end 420a of PCM strip is adjacent first end 412a of housing 410 and second end 420b of PCM strip is adjacent second end 412b of housing 410. Similarly PCM strips 420 on right edge surface 416 extend along the entire length L1 of housing 410 from first end 412a of housing 410 to second end 412b. Although not illustrated, strips 420 positioned on the left edge surface 418 as well as the bottom surface 414 may also extend similar lengths L1. In this example, two PCM strips 420 are provided on each of the surfaces of housing 410. But, in other examples, PCM strips 420 may be provided on only one surface of housing 410. Additionally, and as will be discussed further below, a single strip may be provided on any one surface or more than two strips may appear on any one surface, and the size (e.g., length, width, thickness) shape of the PCM strips 420 may differ.

Flow channels 430 are provided in the spaces between adjacent PCM strips 420. Flow channels 430 provide a pathway for air to flow in a direction of arrow A1 shown in FIG. 5. As shown, the shape of flow channels 430 is defined by adjacent outer edges 421 of PCM strips 420, as well as the distance between adjacent flow channels 430. In this example, where PCM strips 420 have continuously planar outer edges 421, flow channels 430 will also have a flow channel with an elongated and rectangular shape.

Figure 9:
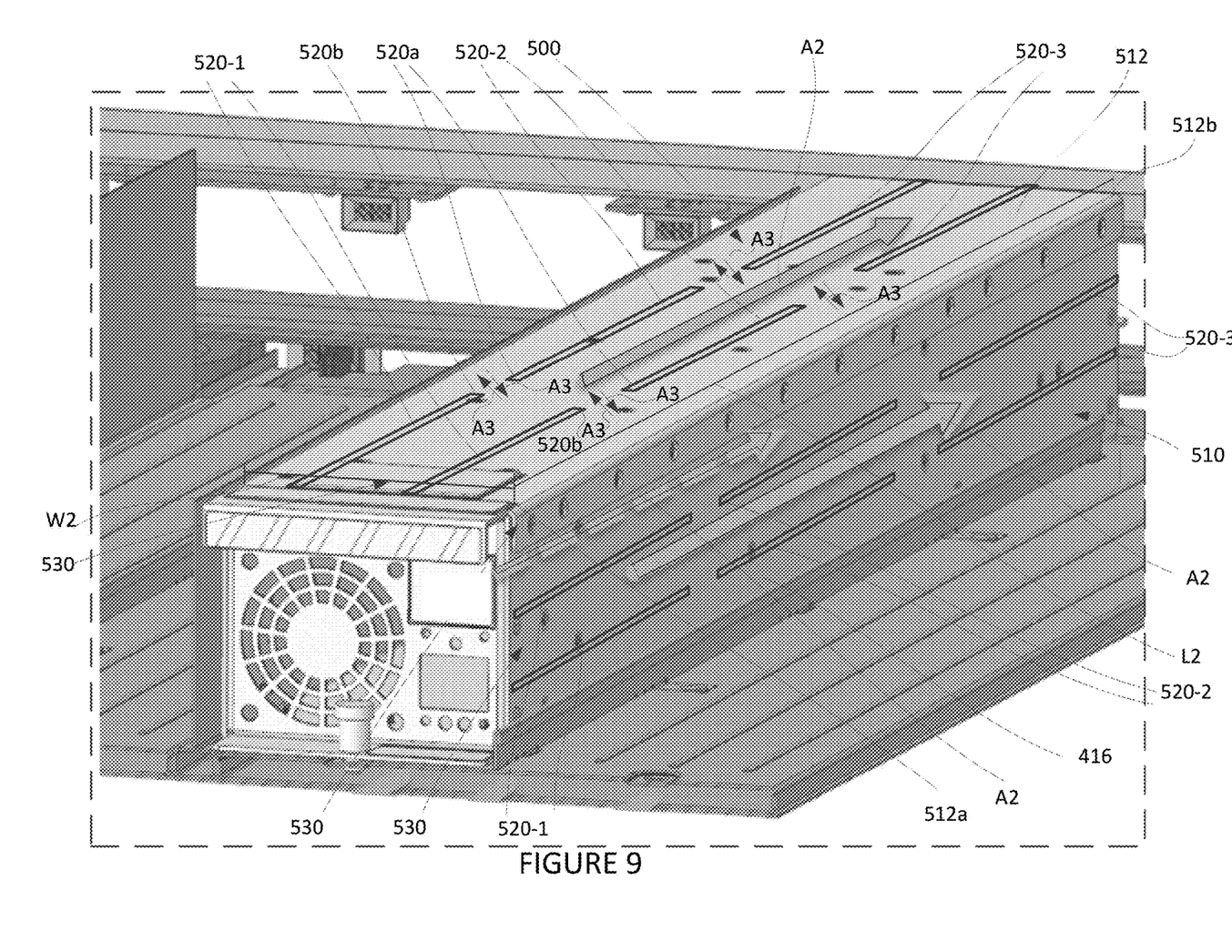
FIG. 9 is another example of a battery unit according to aspects of the disclosure.

In alternative examples, PCM strips and the placement of PCM strips can be further designed to optimize the distribution of heat during battery discharge. As shown in FIG. 9, individual PCM strips do not extend the entire length L2 of battery housing 510 from first end 512a to second end 512b. Instead, multiple PCM strips are shorter in length and provided on surfaces of housing 510. For example, top surface 512 includes six PCM strips: two front strips 520-1, two intermediate strips 520-2, and two rear strips 520-3. Second ends 520b of PCM strips 520-1 are spaced apart from first ends 520a of intermediate PCM strips 520-2. Similarly, second ends 520b of PCM strips 520-2 are spaced apart from first ends 520a of rear PCM strips 520-3. Flow channels 531 extend along a length L2 of housing and a direction of arrow A2. Additional flow channels 531 are formed in the spaces between strips 520-1 and 520-2, as well as between 520-2 and 520-3. The additional flow channels 531 permit the flow of air in two directions across the top surface 512. Thus, air can travel through flow channels 530 in a direction shown by arrows A2 across a length of top surface 512 from the first end 512a to the second end 512b of housing 510. Additionally, due to the spacing between ends of adjacent PCM strips 520, air can flow in a direction across the width W2 of battery housing 510 between first and second peripheral edges, as shown by arrows A3.

Figure 10:
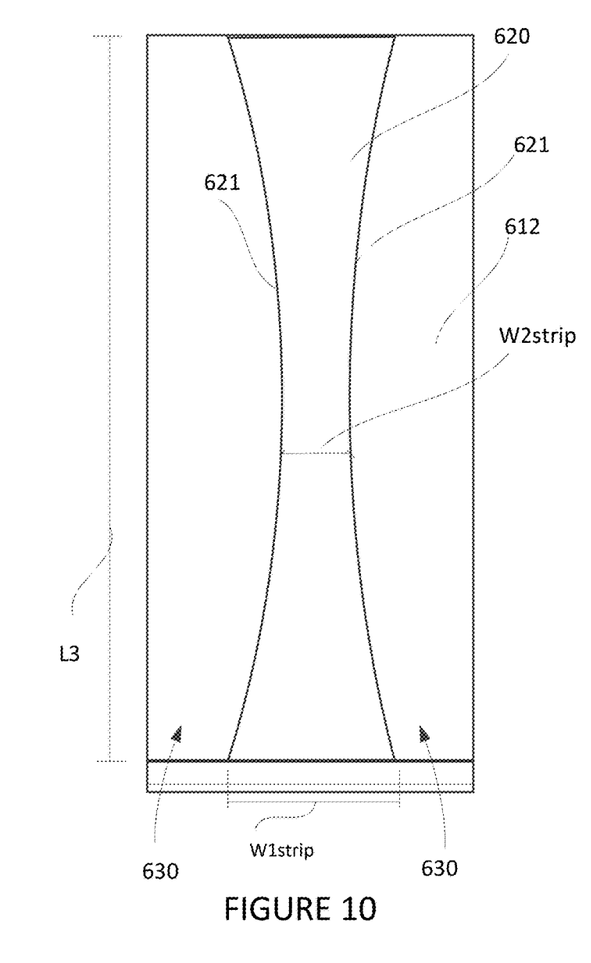
FIG. 10 is another example of a PCM strip according to aspects of the disclosure.
Figure 11:
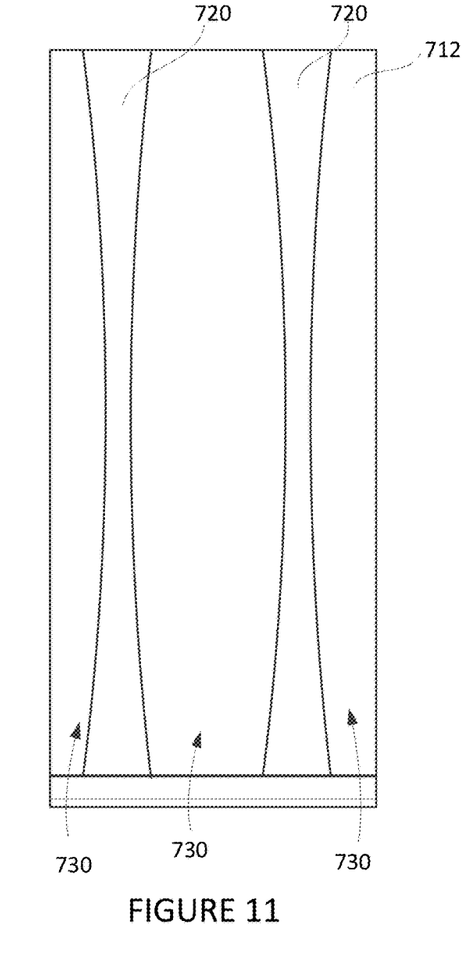
FIG. 11 is another example of a PCM strip according to aspects of the disclosure.
Figure 12:
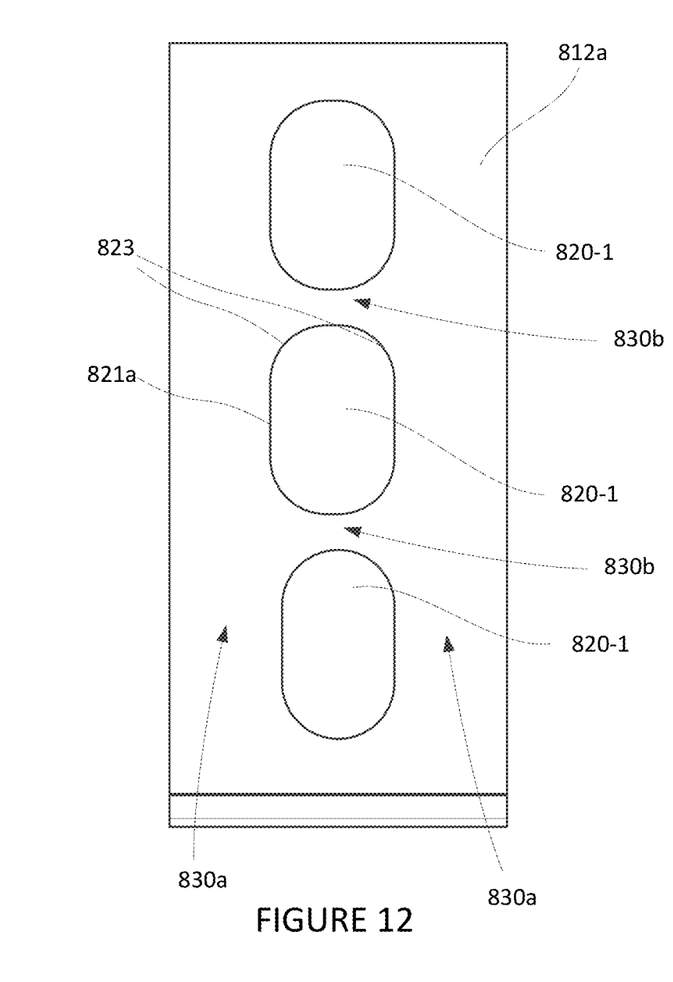
FIG. 12 is another example of a PCM strip according to aspects of the disclosure.

FIGS. 10-12 illustrate additional alternative configurations for PCM strips on one or more surfaces of the battery unit. FIGS. 10-12 illustrate top surfaces of the housing of a battery unit 500, but it is to be appreciated that such configurations can be provided on any one of the surfaces of the housing and is not limited to the top surface or any one surface.

Turning first to FIG. 10, a single PCM strip 620 extends across an entire length L3 of the top surface 612. PCM strip 620 includes opposed edge surfaces 621 that have a parabolic shape and contour, such that the width of the strip changes along length L3. As shown, the width $W1_{STRIP}$ at the outermost edges of PCM strip 620 is greater than a width $W2_{STRIP}$ at the center of the PCM strip 620. This can allow for a greater amount of air to flow through to the center C of the top surface 612 of the housing, as well as help to increase the speed of airflow through the flow channels 630 to better distribute heat.

FIG. 11 illustrates another configuration of PCM strips 720. The edges of the PCM strips have a similar parabolic shape as strip 620 in the prior example, but PCM strips 720 are smaller to allow for two PCM strips 720 to be provided on the top surface 712. This increases the number of flow channels to three air flow channels 730 extending across the housing surface.

FIG. 12 illustrates another configuration of PCM strips 820a. In this example, PCM strips 820-1 are pill-shaped and positioned across the top surface 812A. The pill shaped PCM strips 820-1 each include a partially linear edge 821a as well as a curved edge 823. Air flow channels 830a are formed on opposed sides of PCM strips 820a, and air flow channels 830b are positioned in the spaces between PCM strips 820a. The contours of the curved edges of the PCM strips and the spaces between the pill-shaped PCM strips facilitate air flow around each of PCM strips 820. Air can flow in a horizontal direction across a width of top surface 812a, as well as a vertical directions across a length extending perpendicular to the width.

Figure 13:
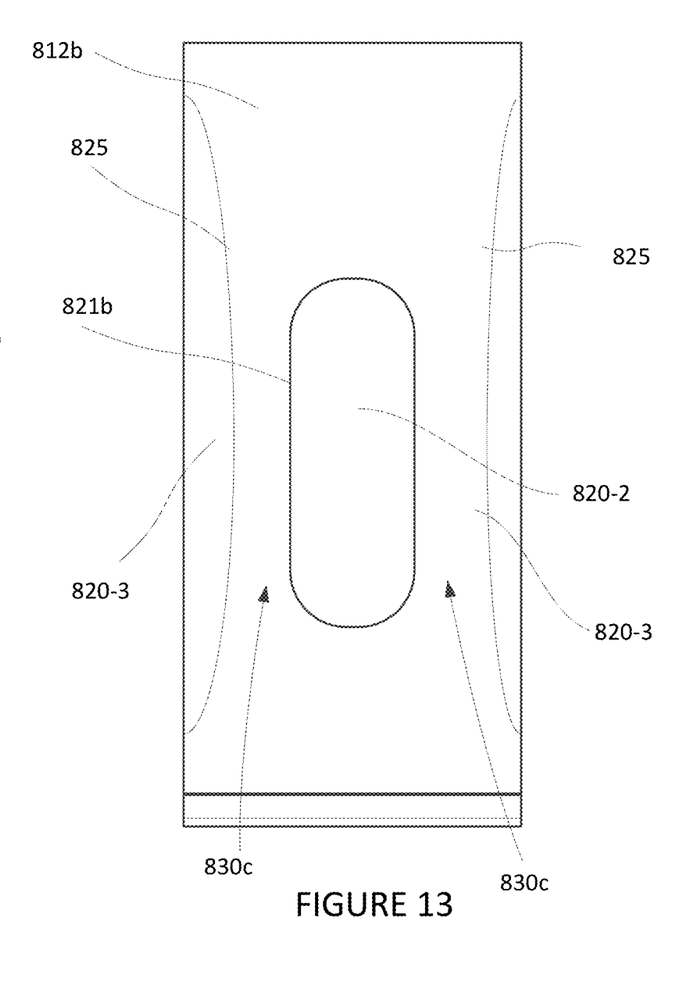
FIG. 13 is another example of a PCM strip according to aspects of the disclosure.

FIG. 13 illustrates another configuration of PCM strips 820b. In this configuration, PCM strips 820b are not symmetrical and arranged in a particular pattern. As shown, a large pill-shaped PCM strip 820-2 is positioned on a central portion of top surface 812b to assist in dissipating heat upon discharge of the battery within the battery unit. PCM strips 820-3 are spaced apart from and positioned on opposed sides of PCM strip 820-2. The spacing creates air flow channels 830c between outer edge 821b of PCM strip 820-2 and the edge 825 of PCM strip 820-3 positioned to the left of PCM strip 820-2, as well as an air flow channel 830c between the outer edge 821b of PCM strip 820-2 and edge 825 of PCM strip 820-3 positioned to the right of PCM strip 820-2. This configuration can allow for purposeful arrangement of PCM strips to overlie a portion of the housing that may be a hot spot or emanate a significant amount of heat, as well as position and create an air flow channel that can distribute heat away from the battery unit. Indeed the curved edges 825 of strips 820-3 will help to increase the speed of airflow across the surface of the housing.

Figure 14:
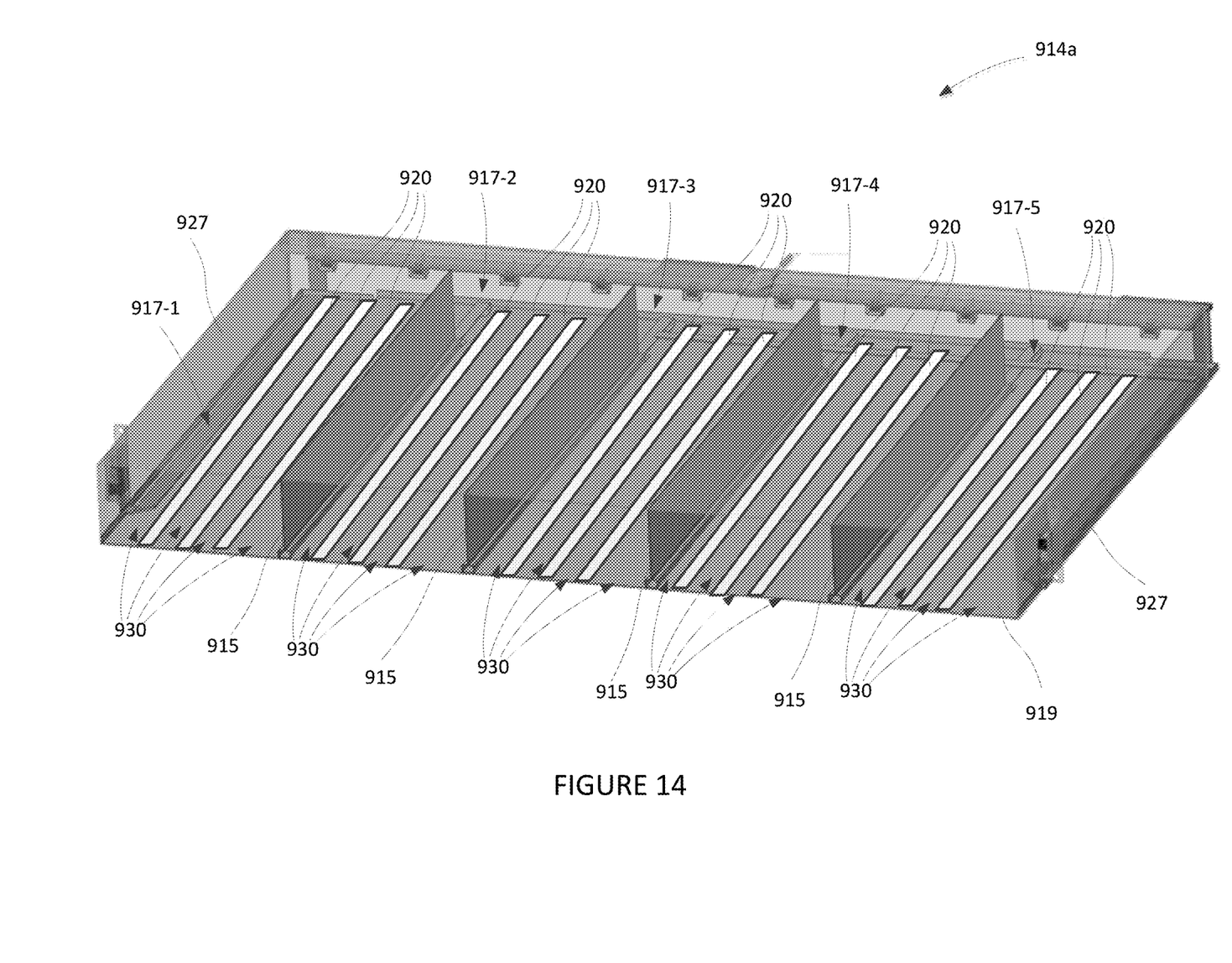
FIG. 14 is another example of a shelf of a server rack according to aspects of the disclosure.

With reference to FIG. 14, an alternative shelf 914a is illustrated. Shelf 914a includes dividers 915 that divide shelf 914a into five compartments 917-1 through 917-5. Shelf 914a is identical to the shelf previously disclosed herein. Each of the compartments are configured to hold two battery units, as shown in the prior embodiments, but any number of compartments may be included. Additionally, or as an alternative to PCM strips being provided directly on battery units disclosed herein, PCM strips 920 may be disposed on the top surface 919 of shelf 914A, as well as flow channels 930. Flow channels 930 are disposed between directly adjacent PCM strips 920, between each divider 915 and an adjacent PCM strip 920, and between the outer shelf walls 927 and a directly adjacent PCM strip 920. In this example, three PCM strips 920 are provided per compartment, but in other examples, any number of strips may be utilized. Additionally, as discussed herein, PCM strips can take on a variety of shapes, configurations, and arrangements on shelf 914a and are not limited to the arrangement shown.

Numerous other configurations of PCM strips may be provided on one or more surfaces of the housing of the battery units or shelf. The PCM strips disclosed herein may be flexible, to allow for greater ease in achieving the desired shapes, sizes, and arrangements of PCM strips on one or more surfaces of a battery unit. The PCM strips can be manufactured to certain specifications, cut from a larger sheet of material, and be flexible or rigid. Additionally, PCM strips may instead be rigid panels having a surface and/or housing directly attached to one or more surfaces of the housing of the battery unit.

Utilizing the structures and methods disclosed herein, thermal management of battery units can be achieved. During any variations in ambient temperature, such as during battery discharge, significant amount of heat is generated within the modular battery unit. PCM strips on the battery unit will continue to absorb heat generated by the battery and/or from within a rack server at a constant temperature until phase change occurs. Air flow channels created by the arrangement of PCM materials allow for further distribution of heat. The combination of the PCM strips and air flow channels allow for greater thermal management control of the modular battery unit.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible implementations. Further, the same reference numbers in different drawings can identify the same or similar elements.

The invention claimed is:

1. A data rack system comprising:
   a data center rack frame;
   a shelf positioned within the data center rack frame; and
   a modular battery unit disposed on the shelf, the modular battery unit comprising:
      a housing having an outermost surface directly exposed to airflow;
      a plurality of strips of phase change material ("PCM") attached to the outermost surface of the housing and spaced apart from one another; and
      air flow channels formed in spaces between two adjacent strips of the plurality of strips, the air flow channels defined by a shape and size of the spaces between the two adjacent strips,
      wherein at least one of the plurality of strips comprises a PCM carrier and a main body encapsulating PCM, and wherein the PCM carrier is attached to the outermost surface of the housing.

2. The data rack system of claim 1, wherein the housing of the modular battery unit includes opposed top and bottom outer surfaces, and opposed side surfaces extending between the top and bottom outer surfaces, wherein at least one strip of the plurality of strips is positioned on a top surface of the modular battery unit.

3. The data rack system of claim 1, wherein the air flow channels direct air in one direction.

4. The data rack system of claim 1, wherein the air flow channels direct air in two directions.

5. The data rack system of claim 1, wherein each of the plurality of strips has an outer edge, and wherein a shape of the air flow channels is further defined by a contour of the outer edge.

6. The data rack system of claim 5, wherein the contour includes a straight line.

7. The data rack system of claim 5, wherein the contour includes a curved line.

8. The data rack system of claim 6, wherein at least two of the plurality of strips are elongated strips having a rectangular shape.

9. The data rack system of claim 7, wherein at least two of the plurality of strips have a parabolic shape.

10. The data rack system of claim 2, wherein at least one of the plurality of strips has a width that changes between a first end of the at least one strip to an opposed second end of the at least one strip.

11. The data rack system of claim 2, wherein the plurality of strips is a first plurality of strips, and wherein the system further comprises a second plurality of strips of phase change material disposed on at least one surface of the shelf.

12. The data rack system of claim 11, wherein the at least one surface of the shelf is an interior surface facing toward a bottom surface of the modular battery unit.

13. The data rack system of claim 1, wherein the plurality of strips are flexible strips.

14. The data rack system of claim 1, wherein the plurality of strips are rigid.

15. The data rack system of claim 1, wherein the PCM comprises a bio based paraffin.

16. A modular battery unit for use in a data center rack, comprising:
   a housing having an outermost top surface directly exposed to airflow and an opposed bottom surface;
   a battery disposed within the housing;

a plurality of strips of phase change material ("PCM") attached to at least the outermost top surface of the housing and spaced apart from one another; and air flow channels provided in spaces between two adjacent strips of the plurality of strips, the air flow channels defined by a shape and size of the spaces between the two adjacent strips, wherein at least one of the plurality of strips comprises a PCM carrier having a top surface and a bottom surface, and wherein the bottom surface of the PCM carrier is attached to the outermost top surface of the housing.

17. The modular battery unit of claim 16, wherein the air flow channels direct air in one direction.

18. The modular battery unit of claim 16, wherein each of the plurality of strips has an outer edge, and wherein the shape of the air flow channels is further defined by a contour of the outer edge.

19. The modular battery unit of claim 18, wherein at least two of the plurality of strips are elongated strips having a rectangular shape.

20. The modular battery unit of claim 18 wherein at least two of the plurality of strips have a parabolic shape.

* * * * *